(12) United States Patent
Kang et al.

(10) Patent No.: US 11,765,954 B2
(45) Date of Patent: Sep. 19, 2023

(54) DISPLAY DEVICE AND METHOD FOR MANUFACTURING THE SAME

(71) Applicant: Samsung Display Co., Ltd., Yongin-si (KR)

(72) Inventors: Jingoo Kang, Suwon-si (KR); Sungwoon Kim, Hwaseong-si (KR); Changhee Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/354,210

(22) Filed: Jun. 22, 2021

(65) Prior Publication Data

US 2022/0123060 A1 Apr. 21, 2022

(30) Foreign Application Priority Data

Oct. 15, 2020 (KR) .................. 10-2020-0133522

(51) Int. Cl.
*H10K 59/35* (2023.01)
*H10K 71/00* (2023.01)
(Continued)

(52) U.S. Cl.
CPC .......... *H10K 59/35* (2023.02); *H10K 59/352* (2023.02); *H10K 71/00* (2023.02); *H10K 50/115* (2023.02); *H10K 50/155* (2023.02); *H10K 50/165* (2023.02)

(58) Field of Classification Search
CPC .................................................... H10K 59/35
See application file for complete search history.

(56) References Cited

U.S. PATENT DOCUMENTS

| 5,537,000 A | * | 7/1996 | Alivisatos | ............... B82Y 20/00 |
| | | | | 313/499 |
| 7,651,674 B2 | * | 1/2010 | Jun | ....................... C09K 11/565 |
| | | | | 977/773 |

(Continued)

FOREIGN PATENT DOCUMENTS

| KR | 10-2019-0058130 A | 5/2019 |
| KR | 10-2019-0143382 A | 12/2019 |
| KR | 10-2020-0016057 A | 2/2020 |

OTHER PUBLICATIONS

Caruge, J.M. et al., "Coloidal quantum-dot light-emitting diodes with metal-oxide charge transport layers," Nature Photonics, Apr. 2008, pp. 247-250, vol. 2, Nature Publishing Group.

(Continued)

*Primary Examiner* — Caleb E Henry
(74) *Attorney, Agent, or Firm* — Lewis Roca Rothgerber Christie LLP

(57) ABSTRACT

A display device including a first light emitting element including a first emission layer and a first charge transport layer adjacent to the first emission layer, the first emission layer including a first quantum dot to emit first light, and a second light emitting element including a second emission layer and a second charge transport layer adjacent to the second emission layer, the second emission layer including a second quantum dot to emit second light that is longer in wavelength than the first light. The first charge transport layer includes a first metal oxide. The second charge transport layer includes a second metal oxide different from the first metal oxide.

18 Claims, 7 Drawing Sheets

(51) Int. Cl.
*H10K 50/115* (2023.01)
*H10K 50/155* (2023.01)
*H10K 50/165* (2023.01)

(56) References Cited

U.S. PATENT DOCUMENTS

| | | | | |
|---|---|---|---|---|
| 7,910,400 | B2* | 3/2011 | Kwon | H01L 51/502 |
| | | | | 257/E21.007 |
| 9,073,752 | B2 | 7/2015 | Kang et al. | |
| 9,525,148 | B2 | 12/2016 | Kazlas et al. | |
| 9,768,404 | B1* | 9/2017 | Steckel | H01L 51/5096 |
| 9,812,004 | B1* | 11/2017 | Boshernitzan | G08C 17/02 |
| 9,831,706 | B2* | 11/2017 | MacWilliams | H02J 7/32 |
| 9,874,693 | B2* | 1/2018 | Baiocco | H01L 21/762 |
| 10,014,438 | B2 | 7/2018 | Bawendi et al. | |
| 10,394,378 | B2* | 8/2019 | Huang | G06F 3/0412 |
| 10,461,131 | B2 | 10/2019 | Steckel et al. | |
| 10,686,019 | B2 | 6/2020 | Lee et al. | |
| 10,826,011 | B1* | 11/2020 | Angioni | H01L 27/3246 |
| 2006/0039850 | A1* | 2/2006 | Jun | C09K 11/08 |
| | | | | 423/561.1 |
| 2010/0140586 | A1* | 6/2010 | Char | C09K 11/883 |
| | | | | 257/14 |
| 2012/0280345 | A1* | 11/2012 | Zhu | G02B 6/1226 |
| | | | | 257/E31.127 |
| 2013/0037778 | A1* | 2/2013 | Kazlas | C09K 11/883 |
| | | | | 257/E29.024 |
| 2014/0027816 | A1* | 1/2014 | Cea | H01L 29/1054 |
| | | | | 257/E29.085 |
| 2014/0197507 | A1* | 7/2014 | Assefa | H01L 31/0745 |
| | | | | 438/69 |
| 2015/0091093 | A1* | 4/2015 | Bouche | H01L 27/092 |
| | | | | 257/369 |
| 2015/0268417 | A1* | 9/2015 | Assefa | H01L 27/1461 |
| | | | | 385/14 |
| 2016/0027848 | A1* | 1/2016 | Liu | H01L 51/502 |
| | | | | 257/40 |
| 2016/0240590 | A1* | 8/2016 | Liu | H01L 51/5056 |
| 2016/0248029 | A1* | 8/2016 | Liu | H01L 51/5056 |
| 2017/0115823 | A1* | 4/2017 | Huang | H01L 51/502 |
| 2017/0221969 | A1* | 8/2017 | Steckel | H10K 59/32 |
| 2018/0019371 | A1* | 1/2018 | Steckel | H01L 33/505 |
| 2018/0254421 | A1* | 9/2018 | Kinge | H01L 51/426 |
| 2018/0309078 | A1* | 10/2018 | Ju | H01L 51/502 |
| 2018/0351125 | A1* | 12/2018 | He | C09K 11/06 |
| 2018/0366672 | A1* | 12/2018 | Wang | C09K 11/08 |
| 2019/0296264 | A1* | 9/2019 | Mathai | H10K 50/852 |
| 2019/0393435 | A1 | 12/2019 | Kim et al. | |
| 2020/0040255 | A1 | 2/2020 | Park et al. | |
| 2020/0185462 | A1* | 6/2020 | Lee | H10K 59/352 |
| 2020/0203650 | A1* | 6/2020 | Kim | H10K 50/15 |
| 2021/0028385 | A1* | 1/2021 | Sakakibara | H01L 27/322 |
| 2021/0151629 | A1* | 5/2021 | Boardman | H01L 51/5215 |
| 2021/0408416 | A1* | 12/2021 | Angioni | H01L 51/56 |
| 2021/0408417 | A1* | 12/2021 | Angioni | H01L 51/0028 |
| 2022/0013744 | A1* | 1/2022 | Sakakibara | H01L 27/3211 |

OTHER PUBLICATIONS

Chandiran, Aravind Kumar et al., "Quantum-Confined ZnO Nanoshell Photoanodes for Mesoscopic Solar Cells", Nano Letters, 2014, pp. 1190-1195, vol. 14, American Chemical Society.

Greiner, Mark T. et al., "Transition Metal Oxide Work Functions: The Influence of Cation Oxidation State and Oxygen Vacancies", Advanced Functional Materials, 2012, pp. 4557-4568, vol. 22, Wiley Online Library.

Han, Gill Sang et al., "Retarding charge recombination in perovskite solar cells using ultrathin MgO-coated $TiO_2$ nanoparticulate films", Journals of Material Chemistry A, 2015, pp. 9160-9164, vol. 3, The Royal Society of Chemistry.

Mahmood, Khalid et al., "Highly efficient perovskite solar cells based on a nanostructured $WO_3$—$TiO_2$ core-shell electron transporting material", Journals of Material Chemistry A, 2015, pp. 9051-9057, vol. 3, No. 17, The Royal Society of Chemistry.

Wood, V. et al., "Selection of metal oxide charge transport layers for colloidal quantum dot LEDs", ACS NANO, 2009, vol. 3, No. 11, pp. 3581-3586, American Chemical Society.

* cited by examiner

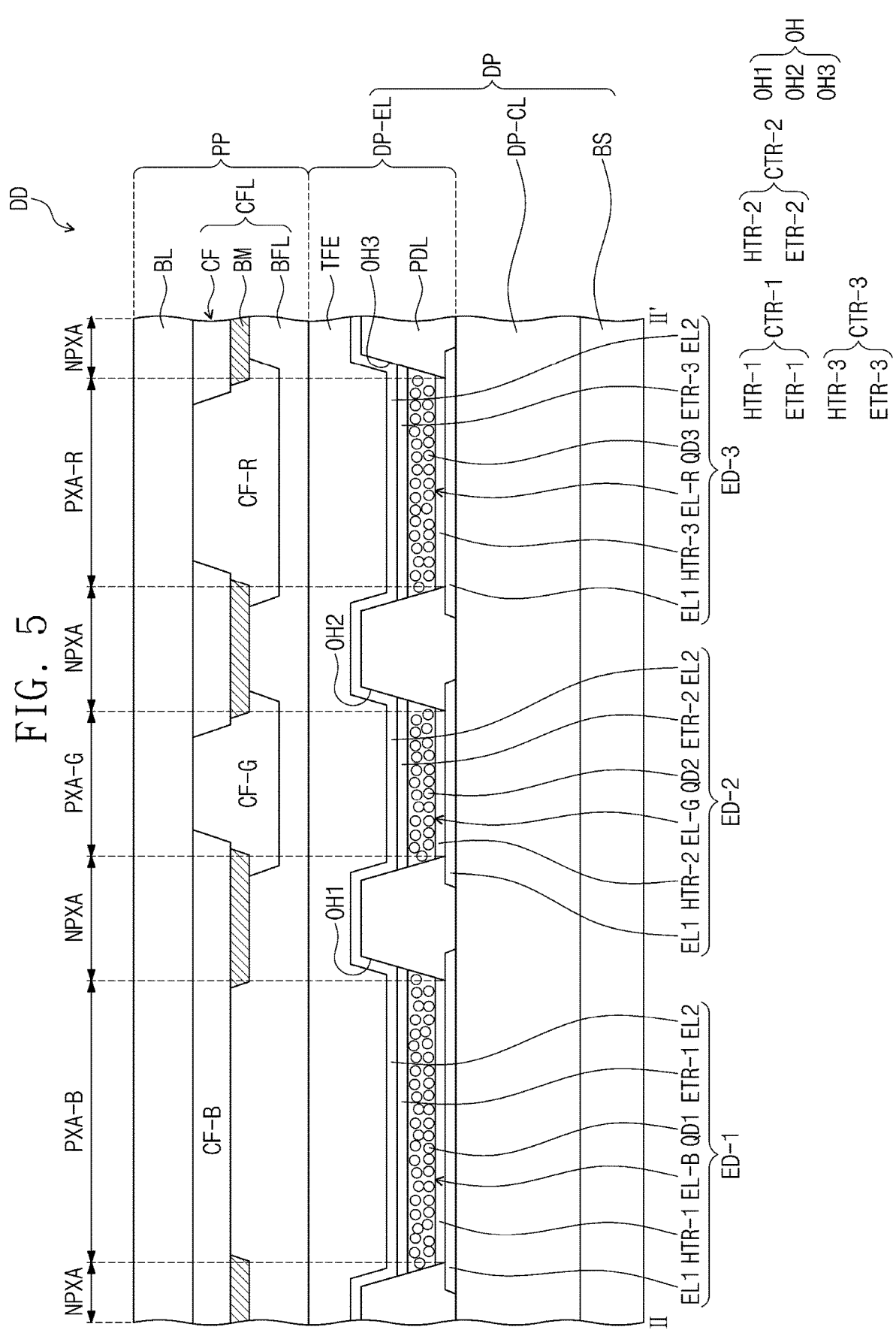

DISPLAY DEVICE AND METHOD FOR MANUFACTURING THE SAME

CROSS-REFERENCE TO RELATED APPLICATIONS

This application claims priority to and the benefit of Korean Patent Application No. 10-2020-0133522, filed on Oct. 15, 2020 in the Korean Intellectual Property Office (KIPO), the entire content of which is hereby incorporated by reference.

BACKGROUND

1. Field

The present disclosure herein relates to a display device and a method for manufacturing the same, and more particularly, to a display device having improved display efficiency and a method for manufacturing the same.

2. Description of the Related Art

Various types of display devices used for multimedia devices such as a television set, a mobile phone, a tablet computer, a navigation system, and a game console are being developed. In such display devices, a so-called self-luminescent display element is used which displays an image by causing an organic compound-containing light emitting material to emit light.

In addition, the development of a light emitting element using quantum dots as a light emitting material is underway as an effort to enhance the color reproducibility of display devices, and there is a demand for increasing the luminous efficiency and service life of a light emitting element using quantum dots.

SUMMARY

Aspects of one or more embodiments of the present disclosure are directed towards a display device having improved display efficiency and a method for manufacturing the same.

Aspects of one or more embodiments of the present disclosure are directed towards a display device in which energy levels of an adjacent charge transport layer are controlled to meet energy levels of light emitting materials included in each light emitting element for light emitting elements emitting light of different wavelengths, and a method for manufacturing the same.

An embodiment of the present disclosure provides a display device including a first light emitting element including a first emission layer and a first charge transport layer adjacent to the first emission layer, the first emission layer including a first quantum dot to emit first light, and a second light emitting element including a second emission layer and a second charge transport layer adjacent to the second emission layer, the second emission layer including a second quantum dot to emit second light that is longer in wavelength than the first light. The first charge transport layer includes a first metal oxide. The second charge transport layer includes a second metal oxide different from the first metal oxide.

In an embodiment, the first charge transport layer may have a first energy level. The second charge transport layer may have a second energy level different from the first energy level.

In an embodiment, the first charge transport layer may include a first hole transport layer and a first electron transport layer spaced from the first hole transport layer with the first emission layer therebetween. The second charge transport layer may include a second hole transport layer and a second electron transport layer spaced from the second hole transport layer with the second emission layer therebetween.

In an embodiment, the first hole transport layer may have a first valance band maximum. The second hole transport layer may have a second valance band maximum, the second valance band maximum being smaller in absolute value than the first valance band maximum.

In an embodiment, the first electron transport layer may have a first conduction band minimum. The second electron transport layer may have a second conduction band minimum, the second conduction band minimum being greater in absolute value than the first conduction band minimum.

In an embodiment, the first hole transport layer may include the first metal oxide. The second hole transport layer may include the second metal oxide.

In an embodiment, the first electron transport layer may include the first metal oxide. The second electron transport layer may include the second metal oxide.

In an embodiment, the display device according to an embodiment of the present disclosure may further include a pixel defining film defining a plurality of openings in which the first light emitting element and the second light emitting element are arranged. The first charge transport layer and the second charge transport layer are in the plurality of openings.

In an embodiment, the first metal oxide may be an oxide of a first metal. The second metal oxide may be an oxide of a second metal, the first metal and the second metal being different from each other.

In an embodiment, the first metal oxide and the second metal oxide each may be an oxide of a material in which a main metal is doped with a doping metal. A first doping ratio of the doping metal in the first metal oxide is different from a second doping ratio of the doping metal in the second metal oxide.

In an embodiment, the first metal oxide may be an oxide of a material in which a first main metal is doped with a first doping metal. The second metal oxide may be an oxide of a material in which a second main metal is doped with a second doping metal. The first doping metal and the second doping metal may be different from each other.

In an embodiment, one of the first metal oxide or the second metal oxide may include a metal oxide particle and a shell surrounding the metal oxide particle, the metal oxide particle and the shell having different energy levels from each other.

In an embodiment, a first oxidation of the first metal oxide is different from a second oxidation of the second metal oxide.

In an embodiment, the first charge transport layer may be smaller in thickness than the second charge transport layer.

In an embodiment of the present disclosure, a display device may include a first light emitting element including a first emission layer and a first charge transport layer adjacent to the first emission layer, the first emission layer including a first quantum dot to emit first light, and a second light emitting element including a second emission layer and a second charge transport layer adjacent to the second emission layer, the second emission layer including a second quantum dot to emit second light that is longer in wavelength than the first light. The first charge transport layer includes a first material. The second charge transport layer includes a second material different from the first material. The first charge transport layer has a first energy level. The second charge transport layer has a second energy level. The first energy level and the second energy level are different from each other.

In an embodiment, the display device according to an embodiment of the present disclosure may further include a pixel defining film defining a plurality of openings in which the first light emitting element and the second light emitting element are arranged. The first charge transport layer and the second charge transport layer may be in the plurality of openings.

In an embodiment of the present disclosure, a method for manufacturing a display device includes manufacturing a first light emitting element including a first emission layer and a first charge transport layer adjacent to the first emission layer, the first emission layer including a first quantum dot emitting first light, and manufacturing a second light emitting element including a second emission layer and a second charge transport layer adjacent to the second emission layer, the second emission layer including a second quantum dot to emit second light that is longer in wavelength than the first light. The first charge transport layer is formed by providing a first metal oxide through a printing process. The second charge transport layer is formed by providing a second metal oxide different from the first metal oxide through a printing process.

In an embodiment, the method may further include forming a pixel defining film defining a plurality of openings in which the first light emitting element and the second light emitting element are arranged. The first charge transport layer may be formed by providing the first metal oxide to a first opening from among the plurality of openings. The second charge transport layer may be formed by providing the second metal oxide to a second opening from among the plurality of openings.

In an embodiment, the first charge transport layer may include a first hole transport layer, and the second charge transport layer may include a second hole transport layer. The first hole transport layer may have a first valance band maximum, and the second hole transport layer may have a second valance band maximum. The second valance band maximum may be smaller in absolute value than the first valance band maximum.

In an embodiment, the first charge transport layer may include a first electron transport layer, and the second charge transport layer may include a second electron transport layer. The first electron transport layer may have a first conduction band minimum, and the second electron transport layer may have a second conduction band minimum. The second conduction band minimum may be greater in absolute value than the first conduction band minimum.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings:

FIG. 5 is a cross-sectional view of a display device according to an embodiment of the present disclosure.

DETAILED DESCRIPTION

Figure 1:
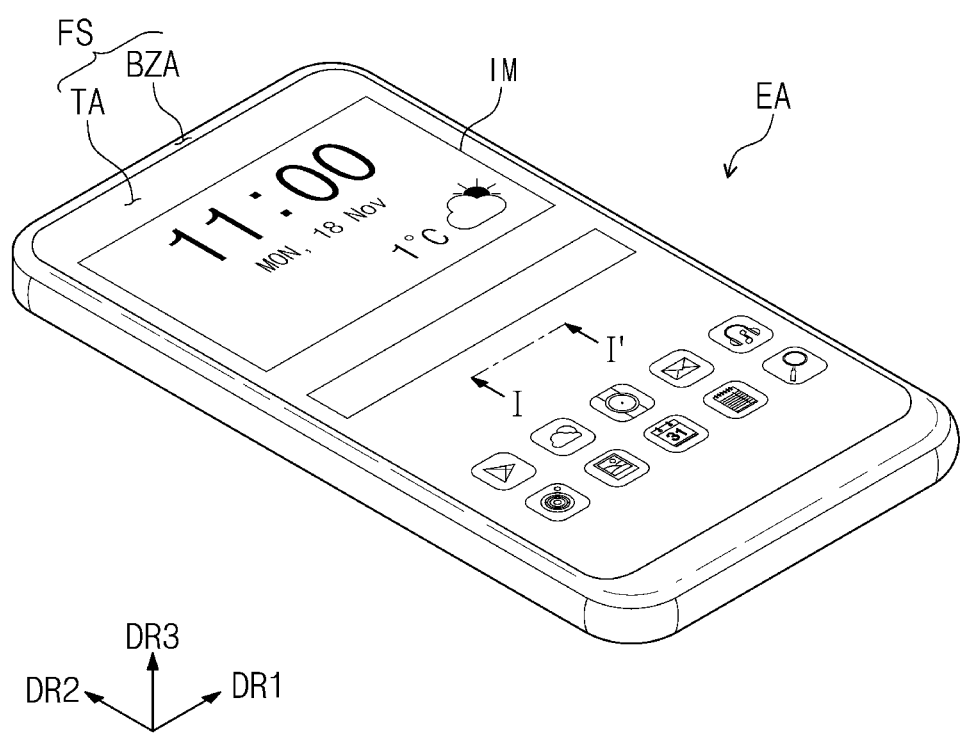
FIG. 1 is a perspective view of an electronic device according to an embodiment of the present disclosure.

Hereinafter, embodiments of the present disclosure will be described with reference to the accompanying drawings. In the present description, when an element (or a region, a layer, a portion, etc.) is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Like reference numerals refer to like elements. Also, in the drawings, the thickness, the ratio, and the dimensions of elements may be exaggerated for an effective description of technical contents. The term "and/or," includes all combinations of one or more of which associated listed items.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a spatially relative terms and are described with reference to the direction indicated in the drawings.

It should be understood that the terms "include," "comprise", and/or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a display device and a method for manufacturing the display device according to an embodiment of the present disclosure will be described with reference to the accompanying drawings.

As used herein, the singular forms "a," "an," and "the" are intended to include the plural forms as well, unless the context clearly indicates otherwise.

As used herein, expressions such as "at least one of," "one of," and "selected from," when preceding a list of elements, modify the entire list of elements and do not modify the individual elements of the list.

Further, the use of "may" when describing embodiments of the present disclosure refers to "one or more embodiments of the present disclosure".

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
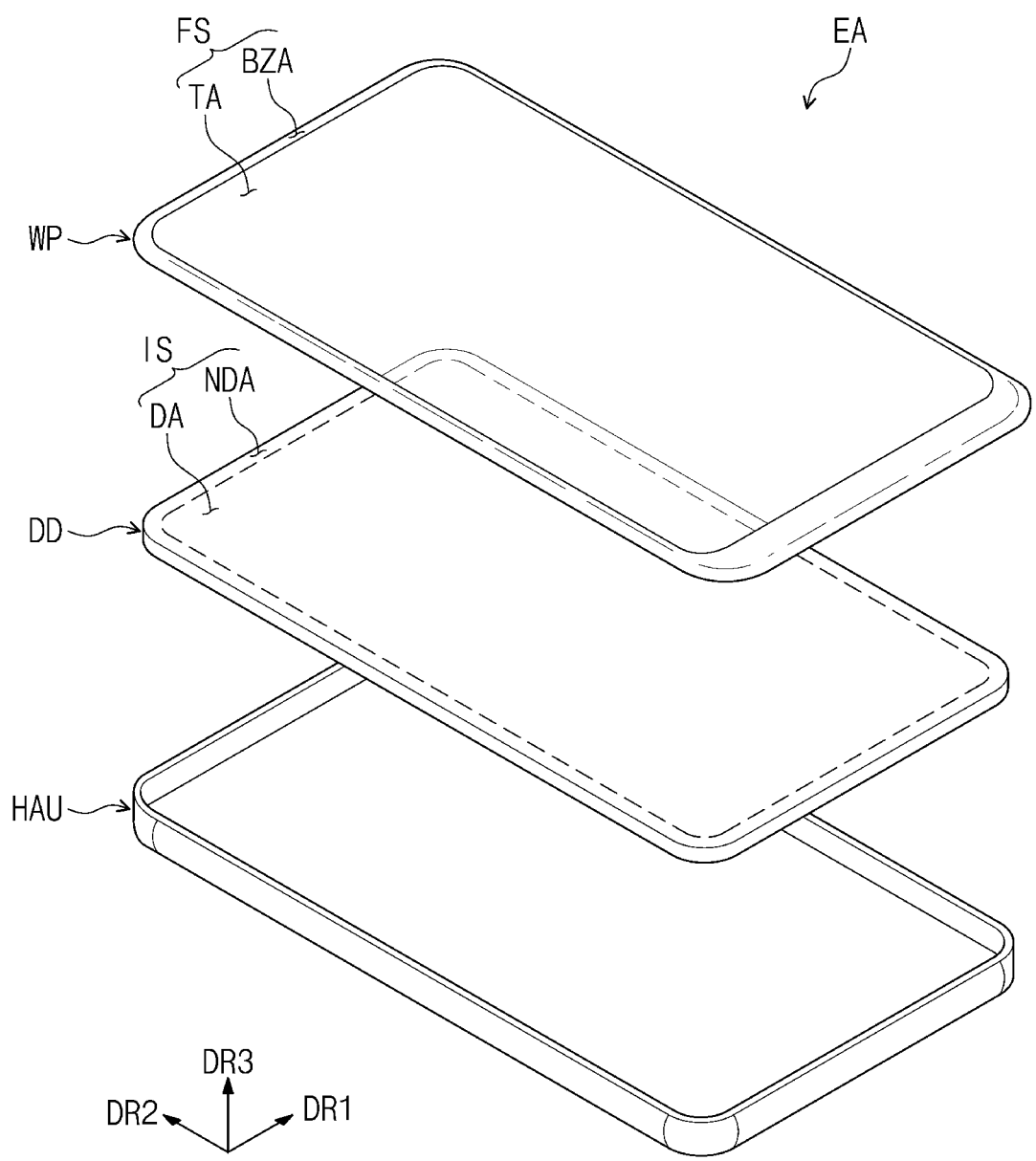
FIG. 2 is an exploded perspective view of an electronic device according to an embodiment of the present disclosure.
Figure 3:
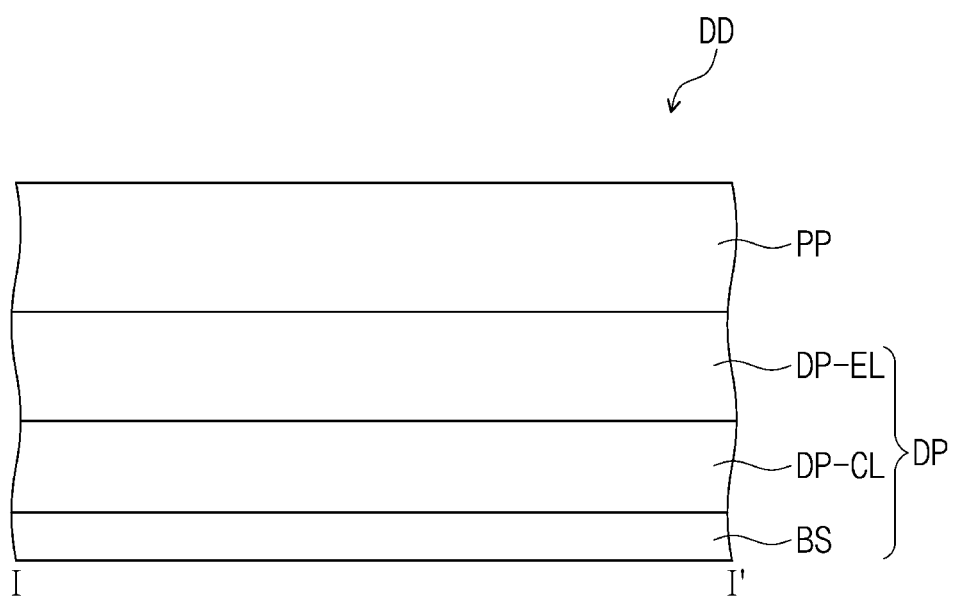
FIG. 3 is a cross-sectional view of a display device according to an embodiment of the present disclosure.
Figure 4:
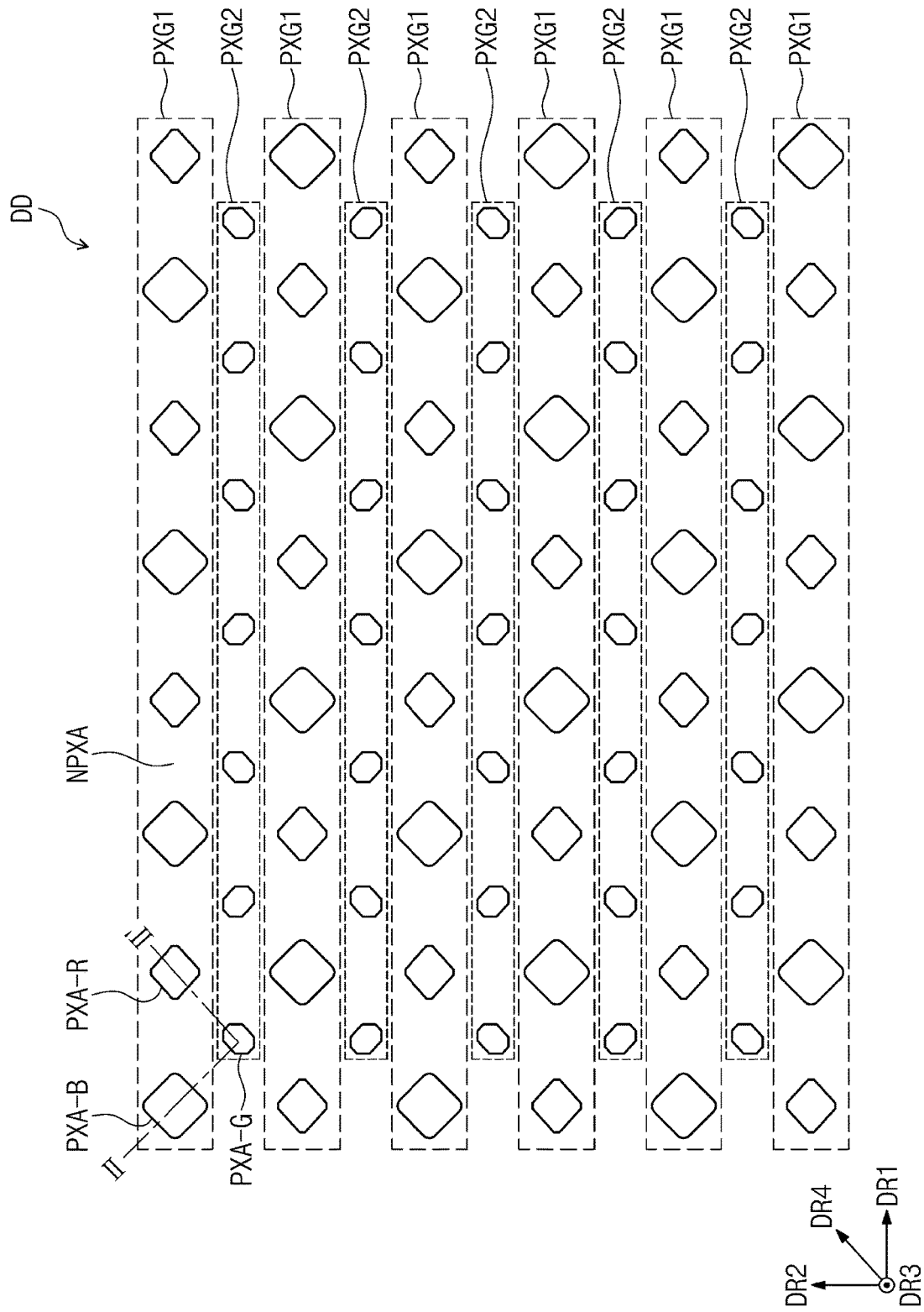
FIG. 4 is a plan view of a display device according to an embodiment of the present disclosure.

FIG. 1 is a perspective view of an electronic device according to an embodiment of the present disclosure. FIG. 2 is an exploded perspective view of an electronic device according to an embodiment of the present disclosure. FIG. 3 is a cross-sectional view of a display device according to an embodiment of the present disclosure. FIG. 4 is a plan view of a display device according to an embodiment of the present disclosure. FIG. 5 is a cross-sectional view of a display device according to an embodiment of the present disclosure. FIG. 3 illustrates a cross-section of the line I-I' shown in FIG. 1. FIG. 5 illustrates a cross-section of the line II-II' shown in FIG. 4.

In an embodiment, an electronic device EA may be a large-sized electronic device such as a television set, a monitor, or an outdoor billboard. In addition, the electronic device EA may be a small-sized or medium-sized electronic device such as a personal computer, a laptop computer, a personal digital terminal, a car navigation unit, a game console, a smartphone, a tablet, and a camera. In addition, these are merely presented as an example, and thus it may be adopted for other electronic devices without departing from the present disclosure. In one or more embodiments, as an example, a smartphone may be illustrated as the electronic device EA.

The electronic device EA may include a display device DD and a housing HAU. The display device DD may display an image IM through a display surface IS. FIG. 1 illustrates that the display surface IS is parallel to a plane defined by a first direction DR1 and a second direction DR2 crossing the first direction DR1. However, this is presented as an example, and in another embodiment, the display surface IS of the display device DD may have a curved shape.

Among the normal directions of display surface IS, that is, the thickness directions of the display device DD, a direction in which the image IM is displayed is indicated by a third direction DR3. A front surface (or an upper surface) and a rear surface (or a lower surface) of respective members may be separated or spaced from each other in the third direction DR3.

A fourth direction DR4 (e.g., see FIG. 4) may be a direction between the first direction DR1 and the second direction DR2. The fourth direction DR4 may be positioned on a plane parallel to the plane defined by the first direction DR1 and the second direction DR2. In an embodiment, the directions indicated by the first to fourth directions (i.e., the first direction DR1, the second direction DR2, the third direction DR3 and the fourth direction DR4) are spatially relative terms, and may thus be changed to other directions.

The display surface IS on which the image IM is displayed in the electronic device EA may correspond to a front surface of the display device DD and may correspond to a front surface FS of a window WP. Hereinafter, like reference numerals or indications will be given for the display surface IS and the front surface of the electronic device EA, and the front surface FS of the window WP. The image IM may include (e.g., be) a still image and/or a dynamic image. In an embodiment, the electronic device EA may include a foldable display device having a folding area and a non-folding area, or a bending display device having at least one bending portion.

The housing HAU may accommodate the display device DD. The housing HAU may be disposed to cover the display device DD such that an upper surface, which is the display surface IS of the display device DD, is exposed. The housing HAU may cover a side surface and a bottom surface of the display device DD, and expose the whole upper surface of the display device DD. However, the present disclosure is not limited thereto, and the housing HAU may cover a portion of the upper surface of the display device DD and/or the side and bottom surfaces of the display device DD.

In the electronic device EA of an embodiment, the window WP may include an optically transparent insulating material. The window WP may include a transmission area TA and a bezel area BZA. The front surface FS of the window WP including the transmission area TA and the bezel area BZA corresponds to the front surface FS of the electronic device EA. Users may view images provided through the transmission area TA corresponding to the front surface FS of the electronic device EA.

In FIGS. 1 and 2, the transmission area TA is shown in a rectangular shape with vertices rounded. However, this is presented as an example, and the transmission area TA may have various suitable shapes and is not limited to any one embodiment.

The transmission area TA may be an optically transparent area. The bezel area BZA may be an area having a relatively lower light transmittance than the transmission area TA. The bezel area BZA may have a set color (e.g., a predetermined color). The bezel area BZA may be adjacent to the transmission area TA and may be around (e.g., surround) the transmission area TA. The bezel area BZA may define the shape of the transmission area TA. However, the present disclosure is not limited to the one illustrated, and the bezel area BZA may be disposed adjacent only to one side of the transmission area TA, and a portion thereof may be omitted.

The display device DD may be disposed below the window WP. In the present description, "below" may indicate a direction opposite to the direction in which the display device DD provides an image.

In an embodiment, the display device DD may be substantially configured to generate an image IM. The image IM (i.e., the image IM generated in the display device DD) is displayed on the display surface IS, and is viewed by users through the transmission area TA from the outside. The display device DD includes a display area DA and a non-display area NDA. The display area DA may be an area activated according to electrical signals. The non-display area NDA may be an area covered by the bezel area BZA. The non-display area NDA is adjacent to the display area DA. The non-display area NDA may be around (e.g., surround) the display area DA.

The display device DD may include a display panel DP and a light control layer PP disposed on the display panel DP. The display panel DP may include a display element layer DP-EL. The display element layer DP-EL includes a light emitting element ED.

The display device DD may include a plurality of light emitting elements ED-1, ED-2, and ED-3 (e.g., see FIG. 5). The light control layer PP may be disposed on the display panel DP to control reflected light in the display panel DP due to external light. The light control layer PP may include, for example, a polarizing layer or a color filter layer.

In the display device DD of an embodiment, the display panel DP may be a light emitting display panel. For example, the display panel DP may be a quantum dot light emitting display panel including a quantum dot light emitting element. However, the present disclosure is not limited thereto, and the display panel DP may be an organic light emitting display panel including an organic electroluminescence element.

The display panel DP may include a base substrate BS, a circuit layer DP-CL disposed on the base substrate BS, and a display element layer DP-EL disposed on the circuit layer DP-CL.

The base substrate BS may be a member providing a base surface on which the display element layer DP-EL is disposed. The base substrate BS may be a glass substrate, a metal substrate, a plastic substrate, etc. However, the present disclosure is not limited thereto, and the base substrate BS may be an inorganic layer, an organic layer or a composite material layer. The base substrate BS may be a flexible substrate that may be readily bent or folded.

In an embodiment, the circuit layer DP-CL may be disposed on the base substrate BS, and the circuit layer DP-CL may include a plurality of transistors. The transistors each may include a control electrode, an input electrode, and an output electrode. For example, the circuit layer DP-CL may include a switching transistor and a driving transistor for driving the light emitting element ED of the display element layer DP-EL.

FIG. 4 is a plan view of a display device according to an embodiment of the present disclosure. FIG. 5 is a cross-sectional view of a display device DD according to an embodiment. FIG. 5 is a cross-sectional view corresponding to the line II-II' of FIG. 4.

Referring to FIGS. 4 and 5, the display device DD of an embodiment includes a plurality of light emitting elements ED-1, ED-2, and ED-3, and the light emitting elements ED-1, ED-2, and ED-3 respectively include emission layers EL-B, EL-G, and EL-R having respective quantum dots QD1, QD2, and QD3.

In addition, the display device DD of an embodiment may include a display panel DP containing the plurality of light emitting elements ED-1, ED-2 and ED-3, and a light control layer PP disposed on the display panel DP. In an embodiment, unlike the embodiment illustrated in the drawing, the light control layer PP may be omitted from the display device DD.

The display panel DP may include a base substrate BS, a circuit layer DP-CL and a display element layer DP-EL provided on the circuit layer DP-CL, and the display element layer DP-EL may include a pixel defining film PDL, light emitting elements ED-1, ED-2 and ED-3 disposed between the pixel defining film PDL, and an encapsulation layer TFE disposed on the light emitting elements ED-1, ED-2 and ED-3.

The display device DD may include a peripheral area NPXA and light emitting areas PXA-B, PXA-G and PXA-R. Each of the light emitting areas PXA-B, PXA-G and PXA-R may be an area emitting light generated from respective ones of the light emitting elements ED-1, ED-2 and ED-3. The light emitting areas PXA-B, PXA-G and PXA-R may be spaced from one another on a plane.

The light emitting areas PXA-B, PXA-G and PXA-R may be divided into a plurality of groups according to colors of light generated from the light emitting elements ED-1, ED-2 and ED-3. In the display device DD of an embodiment illustrated in FIGS. 4 and 5, three light emitting areas PXA-B, PXA-G and PXA-R respectively emitting blue light, green light, and red light are illustrated as an example. For example, the display device DD of an embodiment may include a blue light emitting area PXA-B, a green light emitting area PXA-G, and a red light emitting area PXA-R, which are distinct from one another.

The plurality of light emitting elements ED-1, ED-2 and ED-3 may emit light in different wavelength ranges from each other. For example, in an embodiment, the display device DD may include a first light emitting element ED-1 emitting blue light, which is first light, a second light emitting element ED-2 emitting green light, which is second light, and a third light emitting element ED-3 emitting red light, which is third light. However, the present disclosure is not limited thereto, and the first to third light emitting elements (i.e., the first light emitting element ED-1, the second light emitting element ED-2 and the third light emitting element ED-3) may emit light in the same wavelength range or emit light in at least one different wavelength range.

For example, the blue light emitting area PXA-B, the green light emitting area PXA-G, and the red light emitting area PXA-R of the display device DD may correspond to the first light emitting element ED-1, the second light emitting element ED-2, and the third light emitting element ED-3, respectively.

The first emission layer EL-B of the first light emitting element ED-1 may include a first quantum dot QD1. The second emission layer EL-G of the second light emitting element ED-2 may include a second quantum dot QD2. The third emission layer EL-R of the third light emitting element ED-3 may include a third quantum dot QD3. The first quantum dot QD1 may emit blue light, which is the first light, the second quantum dot QD2 may emit green light, which is the second light, and the third quantum dot QD3 may emit red light, which is the third light. In an embodiment, the first light may be light having a central wavelength in a wavelength range of about 410 nm to about 480 nm, the second light may be light having a central wavelength in a wavelength range of about 500 nm to about 570 nm, and the third light may be light having a central wavelength in a wavelength range of about 625 nm to about 675 nm.

The quantum dots QD1, QD2, and QD3 included in the emission layers EL-B, EL-G, and EL-R of an embodiment may be a semiconductor nanocrystal that may be selected from a Group II-VI compound, a Group III-V compound, a Group III-VI compound, a Group compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of gZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

The Group I-III-VI compound may include a ternary compound selected from the group consisting of AgInS, $AgInS_2$, CuInS, $CuInS_2$, $AgGaS_2$, $CuGaS_2$ $CuGaO_2$, $AgGaO_2$, and $AgAlO_2$, and/or may include any mixture thereof, and/or may include a quaternary compound (such as $AgInGaS_2$ and/or $CuInGaS_2$)

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In an embodiment, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, or a quaternary compound may be present in a particle in a uniform or substantially uniform concentration distribution, or may be present in the same particle in a partially different concentration distribution. In addition, a core/shell structure in which one quantum dot surrounds another quantum dot may be present. An interface between a core and a shell may have a concentration gradient in which the concentration of an element present in a shell becomes lower toward the center.

In some embodiments, the quantum dots QD1, QD2, and QD3 may have the core/shell structure including a core having nano-crystals, and a shell surrounding the core, which are described above. The shell of the quantum dots QD1, QD2, and QD3 may serve as a protection layer to prevent or reduce the chemical deformation of the core so as to maintain semiconductor properties, and/or a charging layer to impart electrophoresis properties to the quantum dots QD1, QD2, and QD3. The shell may be a single layer or multiple layers. An interface between a core and a shell may have a concentration gradient in which the concentration of an element present in a shell becomes lower toward the center. An example of the shell of the quantum dots QD1, QD2, and QD3 may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$, but the present disclosure is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the present disclosure is not limited thereto.

The quantum dots QD1, QD2, and QD3 may have a full width at half maximum (FWHM) of a light emitting wavelength spectrum of about 45 nm or less, in one embodiment (e.g., preferably) about 40 nm or less, in one embodiment (e.g., more preferably) about 30 nm or less, and color purity or color reproducibility may be enhanced in the above ranges. In addition, light emitted through the quantum dots QD1, QD2, and QD3 is emitted in all directions, and thus, a viewing angle (e.g., a wide viewing angle) may be improved.

In addition, the form of the quantum dots QD1, QD2, and QD3 may be any suitable form, and more specifically, a quantum dot in the form of spherical, pyramidal, and/or multi-arm, and/or cubic nanoparticles, nanotubes, nanowires, nanofibers, nanoparticles, etc. may be used.

The quantum dots QD1, QD2, and QD3 may control the colors of emitted light according to the particle sizes thereof, and thus the quantum dots QD1, QD2, and QD3 may have various light emitting colors such as blue, red, green, etc. The smaller the particle sizes of the quantum dots QD1, QD2, and QD3 are, light in the short wavelength range may be emitted. For example, in the quantum dots QD1, QD2, and QD3 having the same core, the particle size of the quantum dot QD2 emitting green light may be smaller than the particle size of the quantum dot QD3 emitting red light. In addition, in the quantum dots QD1, QD2, and QD3 having the same core, the particle size of the quantum dot QD1 emitting blue light may be smaller than the particle size of the quantum dot QD2 emitting green light. However, the present disclosure is not limited thereto, and even in the quantum dots QD1, QD2, and QD3 having the same core, the particle sizes may be adjusted according to forming-materials and thickness of a shell. In an embodiment, when the quantum dots QD1, QD2, and QD3 have various light emitting colors such as blue, red, green, etc., the quantum dots QD1, QD2, and QD3 having different light emitting colors may have different core materials from each other.

The quantum dots QD1, QD2, and QD3 may have different band gap energy from each other according to the colors of the emitted light. The quantum dots QD1, QD2, and QD3 may have greater band gap energy when the wavelength of emitted light is shorter. For example, in the quantum dots QD1, QD2, and QD3, the first quantum dot QD1 emitting blue light may have greater band gap energy than the second quantum dot QD2 emitting green light. The second quantum dot QD2 emitting green light may have greater band gap energy than the third quantum dot QD3 emitting red light. That is, the first quantum dot QD1 may have greater band gap energy than each of the second quantum dot QD2 and the third quantum dot QD3, and the second quantum dot QD2 may have greater band gap energy than the third quantum dot QD3. The band gap may be defined as a distance between a conduction band minimum and a valance band maximum. That is, the band gap energy may be a difference between an energy level corresponding to the conduction band minimum and an energy level corresponding to the valance band maximum.

In the light emitting elements ED-1, ED-2, and ED-3 of an embodiment, the emission layers EL-B, EL-G, and EL-R may include a host and a dopant. In an embodiment, the emission layers EL-B, EL-G, and EL-R may include the quantum dots QD1, QD2, and QD3 as a dopant material. In addition, in an embodiment, the emission layers EL-B, EL-G, and EL-R may further include a host material. In an embodiment, in the light emitting elements ED-1, ED-2, and ED-3, the emission layers EL-B, EL-G, and EL-R may emit fluorescence. For example, the quantum dots QD1, QD2, and QD3 may be used as a fluorescent dopant material in the emission layers EL-B, EL-G, and EL-R.

The emission layers EL-B, EL-G, and EL-R may be formed using suitable various methods such as a vacuum deposition method, a spin coating method, a cast method, a Langmuir-Blodgett (LB) method, an inkjet printing method, a laser printing method, a laser induced thermal imaging (LITI) method, etc. In an embodiment, the emission layers EL-B, EL-G, and EL-R may be formed by providing a quantum dot composition including the quantum dots QD1, QD2, and QD3 of an embodiment through an inkjet printing method.

In an embodiment, the first to third quantum dots (i.e., the first quantum dot QD1, the second quantum dot QD2, and the third quantum dot QD3) each may have a ligand bonded on quantum dot surfaces for improving dispersibility.

In the display device DD of an embodiment, as shown in FIGS. 4 and 5, an area of each of the light emitting areas PXA-B, PXA-G and PXA-R may be different in size from one another. In this case, the area may refer to an area when viewed on a plane defined by the first direction DR1 and the second direction DR2.

The light emitting areas PXA-B, PXA-G and PXA-R each may have a different size area (e.g., area in a plan view) from each other according to colors emitted from the corresponding emission layers EL-B, EL-G and EL-R of the light emitting elements ED-1, ED-2 and ED-3. For example, referring to FIGS. 4 and 5, the blue light emitting area PXA-B corresponding to the first light emitting element ED-1 emitting blue light may have a largest area, the green light emitting area PXA-G corresponding to the second light emitting element ED-2 generating green light may have a smallest area, and the red light emitting area PXA-R corresponding to the third light emitting element ED-3 may have an area between the area of the first light emitting element ED-1 and the area of the second light emitting element ED-2 in the display device DD according to an embodiment. However, the present disclosure is not limited thereto, and the light emitting areas PXA-B, PXA-G and PXA-R may emit light other than blue light, green light and red light, or the light emitting areas PXA-B, PXA-G and PXA-R may have the same size area as each other, or the light emitting areas PXA-B, PXA-G, and PXA-R may be provided at different area ratios from those shown in FIG. 4.

Each of the light emitting areas PXA-B, PXA-G and PXA-R may be an area separated by a pixel defining film PDL. The peripheral areas NPXA may be areas between neighboring light emitting areas PXA-B, PXA-G and PXA-R, and may correspond to the pixel defining film PDL. In an embodiment, in the present description, each of the light emitting areas PXA-B, PXA-G and PXA-R may correspond to a pixel. The pixel defining film PDL may separate the light emitting elements ED-1, ED-2 and ED-3. The emission layers EL-B, EL-G and EL-R of the light emitting elements ED-1, ED-2 and ED-3 may be disposed and separated in an opening OH defined by the pixel defining film PDL. In an embodiment, the first emission layer EL-B of the first light emitting element ED-1 may be disposed in a first opening OH1, and the second emission layer EL-G of the second light emitting element ED-2 may be disposed in a second opening OH2, and the third emission layer EL-R of the third light emitting element ED-3 may be disposed in a third opening OH3.

The pixel defining film PDL may be formed of a polymer resin. For example, the pixel defining film PDL may be formed including a polyacrylate-based resin and/or a polyimide-based resin. In addition, the pixel defining film PDL may be formed by further including an inorganic material in addition to the polymer resin. In an embodiment, the pixel defining film PDL may be formed including a light absorbing material, and/or may be formed including a black pigment and/or a black dye. The pixel defining film PDL formed including a black pigment and/or a black dye may implement a black pixel defining film. When forming the pixel defining film PDL, carbon black may be used as a black pigment and/or a black dye, but the present disclosure is not limited thereto.

In addition, the pixel defining film PDL may be formed of an inorganic material. For example, the pixel defining film PDL may be formed including silicon nitride ($SiN_x$), silicon oxide ($SiO_x$), silicon oxynitride ($SiO_xN_y$), etc. The pixel defining film PDL may define light emitting areas PXA-B, PXA-G, and PXA-R. The light emitting areas PXA-B, PXA-G, and PXA-R, and the peripheral area NPXA may be separated by the pixel defining film PDL.

The light emitting elements ED-1, ED-2, and ED-3 may include (e.g., may each include) a first electrode EL1 and a second electrode EL2, and the emission layers EL-B, EL-G, and EL-R may each be disposed between the corresponding first electrode EL1 and the second electrode EL2. Charge transport layers CTR-1, CTR-2, and CTR-3 may be disposed between the emission layers EL-B, EL-G, and EL-R and the first electrode EL1, and/or the emission layers EL-B, EL-G, and EL-R and the second electrode EL2, respectively. In an embodiment, each of the charge transport layers CTR-1, CTR-2, and CTR-3 may be disposed between the corresponding first electrode EL1 and the second electrode EL2.

In the first light emitting element ED-1, the first emission layer EL-B may be disposed between the first electrode EL1 and the second electrode EL2, and the first charge transport layer CTR-1 may be disposed adjacent to the first emission layer EL-B. The first charge transport layer CTR-1 may include a first hole transport region HTR-1 disposed between the first electrode EL1 and the first emission layer EL-B, and a first electron transport region ETR-1 disposed between the second electrode EL2 and the first emission layer EL-B. In the second light emitting element ED-2, the second emission layer EL-G may be disposed between the first electrode EL1 and the second electrode EL2, and the second charge transport layer CTR-2 may be disposed adjacent to the second emission layer EL-G. The second charge transport layer CTR-2 may include a second hole transport region HTR-2 disposed between the first electrode EL1 and the second emission layer EL-G, and a second electron transport region ETR-2 disposed between the second electrode EL2 and the second emission layer EL-G. In the third light emitting element ED-3, the third emission layer EL-R may be disposed between the first electrode EL1 and the second electrode EL2, and the third charge transport layer CTR-3 may be disposed adjacent to the third emission layer EL-R. The third charge transport layer CTR-3 may include a third hole transport region HTR-3 disposed between the first electrode EL1 and the third emission layer EL-R, and a third electron transport region ETR-3 disposed between the second electrode EL2 and the third emission layer EL-R.

The charge transport layers CTR-1, CTR-2, and CTR-3 included in each of the light emitting elements ED-1, ED-2, and ED-3 may be separated from each other by being disposed in the opening OH defined in the pixel defining film PDL. That is, the charge transport layers CTR-1, CTR-2, and CTR-3, like the emission layers EL-B, EL-G, and EL-R included in each of the light emitting elements ED-1, ED-2, and ED-3, may be patterned in the opening OH to correspond to the light emitting elements ED-1, ED-2, and ED-3 without being commonly disposed in the light emitting areas PXA-B, PXA-G, and PXA-R and the peripheral area NPXA. The first hole transport region HTR-1 and the first electron transport region ETR-1 included in the first charge transport layer CTR-1 may be disposed adjacent to the first emission layer EL-B, and may be patterned and disposed in the first opening OH1 in which the first emission layer EL-B is disposed. The second hole transport region HTR-2 and the second electron transport region ETR-2 included in the second charge transport layer CTR-2 may be disposed adjacent to the second emission layer EL-G, and may be patterned and disposed in the second opening OH2 in which the second emission layer EL-G is disposed. The third hole transport region HTR-3 and the third electron transport region ETR-3 included in the third charge transport layer CTR-3 may be disposed adjacent to the third emission layer EL-R, and may be patterned and disposed in the third opening OH3 in which the third emission layer EL-R is disposed. The charge transport layers CTR-1, CTR-2, and CTR-3 each may be provided in the opening OH defined in the pixel defining film PDL through a printing process.

An encapsulation layer TFE may cover the light emitting elements ED-1, ED-2 and ED-3. The encapsulation layer TFE may be a single layer or a laminated layer of a plurality of layers. The encapsulation layer TFE may be a thin film encapsulation layer. The encapsulation layer TFE protects the light emitting elements ED-1, ED-2 and ED-3. The encapsulation layer TFE may cover an upper surface of the second electrode EL2 disposed in the opening OH, and may fill the opening OH.

Figure 6A:
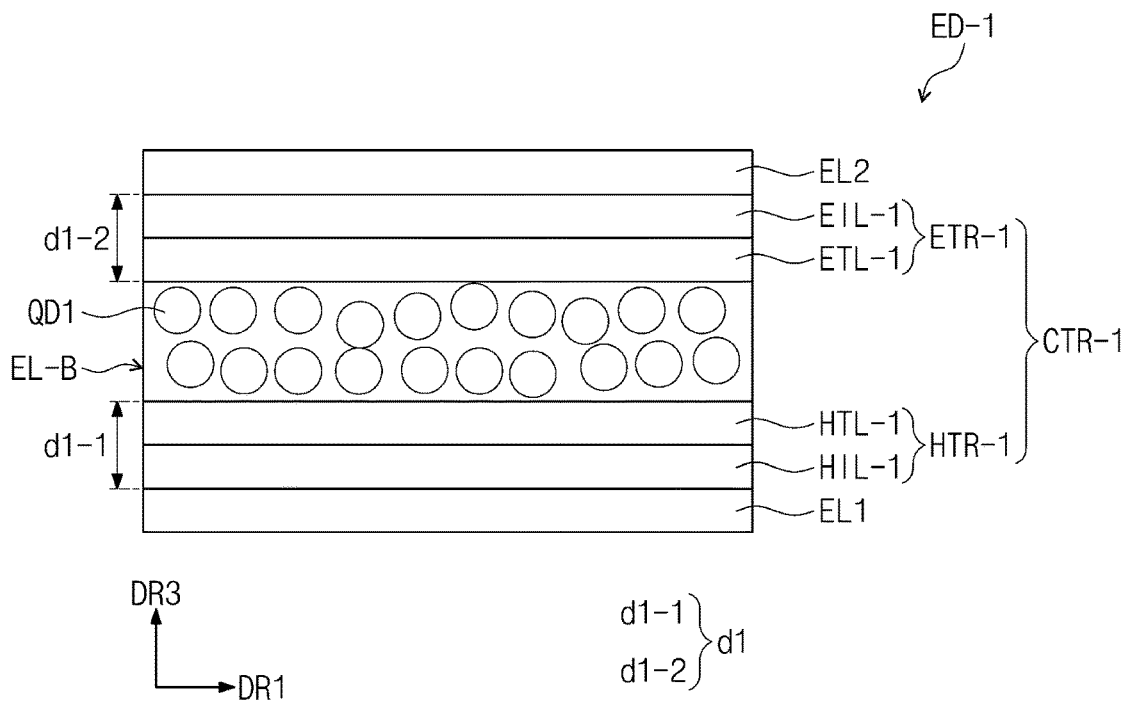
FIGS. 6A-6C are cross-sectional views of a light emitting element according to an embodiment of the present disclosure.
Figure 6B:
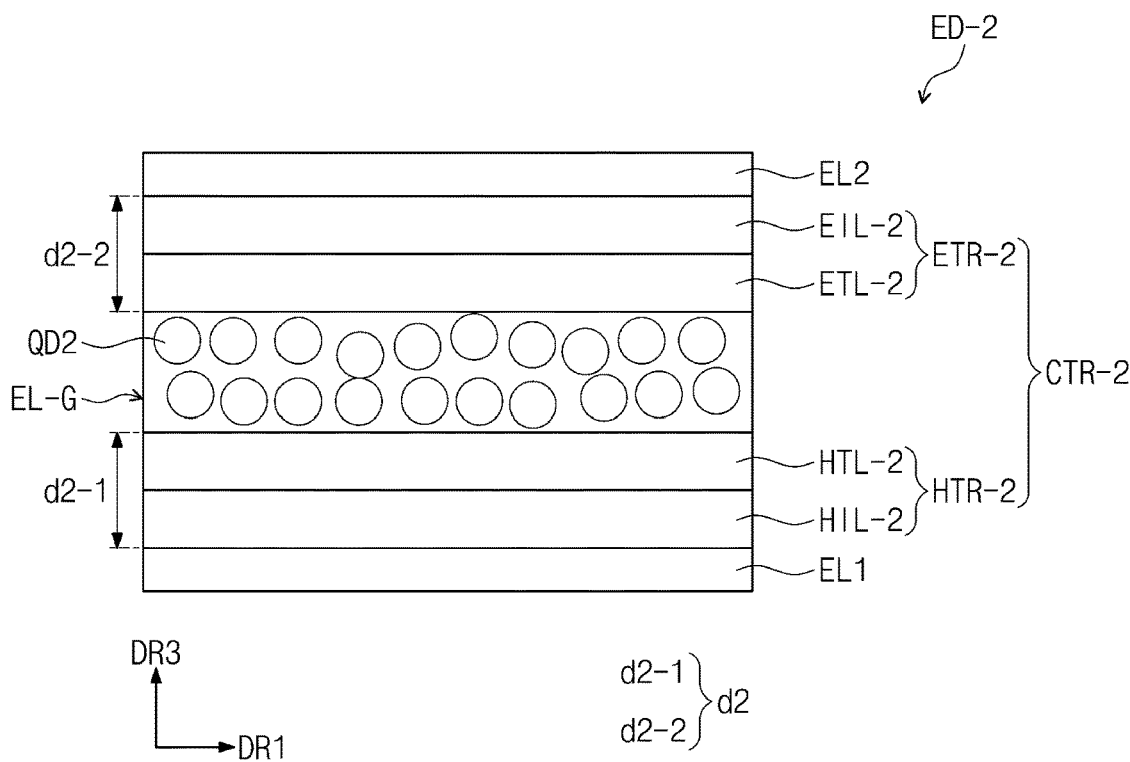
Figure 6C:
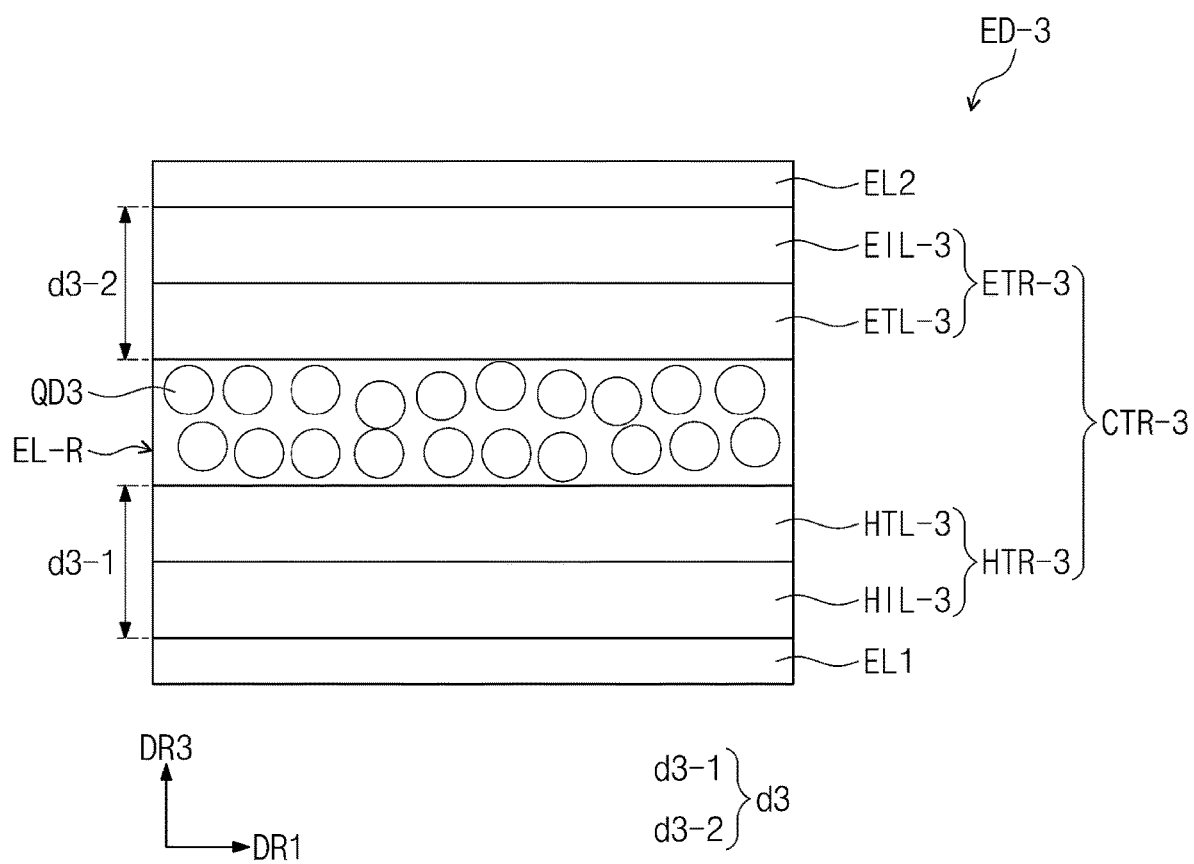

In an embodiment, in the display device DD of an embodiment illustrated in FIG. 5, the thicknesses of the emission layers EL-B, EL-G, and EL-R of the first to third light emitting elements ED-1, ED-2, and ED-3 are illustrated to be similar to one another, but the present disclosure is not limited thereto. For example, in an embodiment, the thicknesses of the emission layers EL-B, EL-G, and EL-R of the first to third light emitting elements ED-1, ED-2, and ED-3 may be different from one another. In addition, thicknesses of the charge transport layers CTR-1, CTR-2, and CTR-3 of the first to third light emitting elements ED-1, ED-2, and ED-3 may also be different from one another. For example, as shown in FIGS. 6A-6C, the first charge transport layer CTR-1 may have a first thickness d1, and the second charge transport layer CTR-2 may have a second thickness d2, the third charge transport layer CTR-3 may have a third thickness d3. The third thickness d3 may be greater than each of the first thickness d1 and the second thickness d2. The second thickness d2 may be greater than the first thickness d1.

Referring to FIG. 4, the blue light emitting areas PXA-B and the red light emitting areas PXA-R may be alternately arranged along the first direction DR1 to form a first group PXG1. The green light emitting areas PXA-G may be arranged (e.g., repeatedly arranged) along the first direction DR1 to form a second group PXG2.

The first group PXG1 and the second group PXG2 may be spaced from each other in the second direction DR2. Each of the first group PXG1 and the second group PXG2 may be provided in plurality. The first groups PXG1 and the second groups PXG2 may be alternately arranged along the second direction DR2.

One green light emitting area PXA-G may be disposed spaced from one blue light emitting area PXA-B or one red light emitting area PXA-R in the fourth direction DR4. The fourth direction DR4 may be a direction between the first direction DR1 and the second direction DR2.

The arrangement structure of the light emitting areas PXA-B, PXA-G and PXA-R shown in FIG. 4 may be referred to as a Pentile structure (PENTILE® is a registered trademark of Samsung Display Co., Ltd., Republic of Korea). However, the arrangement structure of the light emitting areas PXA-B, PXA-G and PXA-R in the display device DD according to the present disclosure is not limited to the arrangement structure shown in FIG. 4. For example, in an embodiment, the light emitting areas PXA-B, PXA-G and PXA-R may have a stripe structure in which the blue light emitting area PXA-B, the green light emitting area PXA-G, and the red light emitting area PXA-R may be alternately arranged along the first direction DR1.

Referring to FIGS. 3 and 5, the display device DD of an embodiment may further include a light control layer PP. The light control layer PP may block external light incident to the display panel DP from the outside the display device DD. The light control layer PP may block some external light. The light control layer PP may perform a reflection preventing function minimizing or reducing reflection due to external light.

In an embodiment illustrated in FIG. 5, the light control layer PP may include a color filter layer CFL. That is, the display device DD of an embodiment may further include the color filter layer CFL disposed on the light emitting elements ED-1, ED-2, and ED-3 of the display panel DP.

In the display device DD of an embodiment, the light control layer PP may include a base layer BL and a color filter layer CFL.

The base layer BL may be a member providing a base surface on which the color filter layer CFL is disposed. The base layer BL may be a glass substrate, a metal substrate, a plastic substrate, etc. However, the present disclosure is not limited thereto, and the base layer BL may be an inorganic layer, an organic layer, or a composite material layer.

The color filter layer CFL may include a light blocking unit BM and a color filter CF. The color filter CF may include a plurality of filters CF-B, CF-G, and CF-R. That is, the color filter layer CFL may include a first filter CF-B transmitting first light, a second filter CF-G transmitting second light, and a third filter CF-R transmitting third light. For example, the first filter CF-B may be a blue filter, the second filter CF-G may be a green filter, and the third filter CF-R may be a red filter.

Each of the filters CF-B, CF-G, and CF-R may include a polymer photosensitive resin and a pigment or a dye. The first filter CF-B may include a blue pigment or a blue dye, the second filter CF-G may include a green pigment or a green dye, and the third filter CF-R may include a red pigment or a red dye.

However, the present disclosure is not limited thereto, and the first filter CF-B may not include a pigment or a dye. The first filter CF-B may include a polymer photosensitive resin, but not include a pigment or a dye. The first filter CF-B may be transparent. The first filter CF-B may be formed of a transparent photosensitive resin.

The light blocking unit BM may be a black matrix. The light blocking unit BM may be formed including an organic light blocking material or an inorganic light blocking material, both including a black pigment or a black dye. The light blocking unit BM may prevent or reduce light leakage, and separate boundaries between the adjacent light emitting areas PXA-B, PXA-G, and PXA-R including the adjacent filters CF-B, CF-G, and CF-R respectively.

The color filter layer CFL may further include a buffer layer BFL. For example, the buffer layer BFL may be a protective layer protecting the filters CF-B, CF-G, and CF-R. The buffer layer BFL may be an inorganic material layer including at least one inorganic material from among silicon nitride, silicon oxide, and silicon oxynitride. The buffer layer BFL may be formed of a single layer or a plurality of layers.

In an embodiment shown in FIG. 5, the first filter CF-B of the color filter layer CFL is illustrated to overlap the second filter CF-G and the third filter CF-R, but the present disclosure is not limited thereto. For example, the first to third filters (i.e., the first filter CF-B, the second color filter CF-G and the third color filter CF-R) may be separated by the light blocking unit BM and may not overlap one another. In an embodiment, each of the first to third filters CF-B, CF-G and CF-R may be disposed corresponding to each of the blue light emitting area PXA-B, the green light emitting area PXA-G, and the red light emitting area PXA-R.

Unlike the embodiment shown in FIG. 5 and the like, the display device DD of an embodiment may include a polarizing layer as a light control layer PP instead of the color filter layer CFL. The polarizing layer may block external light provided to the display panel DP from the outside. The polarizing layer may block some external light.

In addition, the polarizing layer may reduce reflected light generated in the display panel DP due to external light. For example, the polarizing layer may function to block reflected light of a case where light provided from the outside the display device DD is incident on the display panel DP and exits again. The polarizing layer may be a circular polarizer having a reflection preventing function or the polarizing layer may include a linear polarizer and a λ/4 phase retarder. In an embodiment, the polarizing layer may be disposed on the base layer BL to be exposed or the polarizing layer may be disposed below the base layer BL.

FIGS. 6A-6C are cross-sectional views of a light emitting element according to an embodiment of the present disclosure. FIG. 6A illustrates a cross section of a first light emitting element ED-1, FIG. 6B illustrates a cross section of a second light emitting element ED-2, and FIG. 6C illustrates a cross section of a third light emitting element ED-3.

Referring to FIG. 5 together with FIGS. 6A-6C, the light emitting elements ED-1, ED-2, and ED-3 include a first electrode EL1, a second electrode EL2 facing the first electrode EL1, and a plurality of functional layers disposed between the first electrode EL1 and the second electrode EL2 and having emission layers EL-B, EL-G, and EL-R. In an embodiment, in the light emitting elements ED-1, ED-2, and ED-3, a capping layer may be further disposed on the second electrode EL2.

In the light emitting elements ED-1, ED-2, and ED-3 according to an embodiment, the first electrode EL1 has conductivity. The first electrode EL1 may be formed of a metal material, a metal alloy or a conductive compound. The first electrode EL1 may be an anode or a cathode. However, the present disclosure is not limited thereto. In addition, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). Alternatively, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. In addition, the present disclosure is not limited thereto, and the first electrode EL1 may include the above-described metal materials, a combination of two or more metal materials selected from the above-described metal materials, or oxides of the above-described metal materials. The thickness of the first electrode EL1 may be about 700 Å to about 10000 Å. for example, the thickness of the first electrode EL1 may be about 1000 Å to about 3000 Å.

The second electrode EL2 may be a common electrode. The second electrode EL2 may be a cathode or an anode but the present disclosure is not limited thereto. For example, in an embodiment, the first electrode EL1 may be an anode and the second electrode EL2 may be a cathode, and in another embodiment, the first electrode EL1 may be a cathode and the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). Alternatively, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, or oxides of the above-described metal materials.

In an embodiment, the second electrode EL2 may be connected with an auxiliary electrode. When the second electrode EL2 is connected with the auxiliary electrode, the resistance of the second electrode EL2 may decrease.

As described above, the charge transport layers CTR-1, CTR-2, and CTR-3 are disposed adjacent to the emission layers EL-B, EL-G, and EL-R in the light emitting elements ED-1, ED-2, and ED-3. In the first light emitting element ED-1, a first hole transport region HTR-1, a first emission layer EL-B, and a first electron transport region ETR-1 may be disposed (e.g., sequentially disposed) between the first electrode EL1 and the second electrode EL2. In the second light emitting element ED-2, a second hole transport region HTR-2, a second emission layer EL-G, and a second electron transport region ETR-2 may be disposed (e.g., sequentially disposed) between the first electrode EL1 and the second electrode EL2. In the third light emitting element ED-3, a third hole transport region HTR-3, a third emission layer EL-R, and a third electron transport region ETR-3 may be disposed (e.g., sequentially disposed) between the first electrode EL1 and the second electrode EL2.

The hole transport regions HTR-1, HTR-2, and HTR-3, and the electron transport regions ETR-1, ETR-2, and ETR-3 each may include a plurality of sub functional layers. For example, the hole transport regions HTR-1, HTR-2, and HTR-3 may include hole injection layers HIL-1, HIL-2, and HIL-3 and hole transport layers HTL-1, HTL-2, and HTL-3 as sub functional layers, and the electron transport regions ETR-1, ETR-2, and ETR-3 may include electron injection layers EIL-1, EIL-2, and EIL-3 and electron transport layers ETL-1, ETL-2, and ETL-3 as sub functional layers. However, the present disclosure is not limited thereto, and the hole transport regions HTR-1, HTR-2, and HTR-3 may further include an electron blocking layer as a sub functional layer, and the electron transport regions ETR-1, ETR-2, and ETR-3 may further include a hole blocking layer as a sub functional layer. In addition, unlike the embodiment shown in FIGS. 6A-6C, the hole injection layers HIL-1, HIL-2, and HIL-3 or the electron injection layers EIL-1, EIL-2, and EIL-3 may be omitted.

At least some of the charge transport layers CTR-1, CTR-2, and CTR-3 include a metal oxide. At least a portion of the first charge transport layer CTR-1 included in the first light emitting element ED-1 includes a metal oxide. At least a portion of the second charge transport layer CTR-2 included in the second light emitting element ED-2 includes a metal oxide. At least a portion of the third charge transport layer CTR-3 included in the third light-emitting element ED-3 includes a metal oxide. At least a portion of the first charge transport layer CTR-1 includes a first metal oxide, at least a portion of the second charge transport layer CTR-2 includes a second metal oxide, and at least a portion of the third charge transport layer CTR-3 includes a third metal oxide. The first metal oxide, the second metal oxide, and the third metal oxide may be different from each other. At least some of the charge transport layers CTR-1, CTR-2, and CTR-3 include an inorganic material such as a metal oxide, and the stability of the light emitting elements ED-1, ED-2, and ED-3 including the charge transport layers CTR-1, CTR-2, and CTR-3 may thus be improved. In particular, when all layers included in the charge transport layers CTR-1, CTR-2, and CTR-3 include metal oxides, the stability of the light emitting elements ED-1, ED-2, and ED-3 including the charge transport layers CTR-1, CTR-2, and CTR-3 may be further improved.

The charge transport layers CTR-1, CTR-2, and CTR-3 each may have different energy levels according to materials included in the charge transport layers CTR-1, CTR-2, and CTR-3. The first charge transport layer CTR-1 including a first metal oxide, the second charge transport layer CTR-2 including a second metal oxide, and the third charge transport layer CTR-3 including a third metal oxide each may have different energy levels from each other. The first charge transport layer CTR-1 may have a first energy level, the second charge transport layer CTR-2 may have a second energy level, the third charge transport layer CTR-3 may have a third energy level, and the first energy level, the second energy level, and the third energy level may be different from each other. In an embodiment, the first hole transport layer HTL-1 may have the first energy level, the second hole transport layer HTL-2 may have the second energy level, and the third hole transport layer HTL-3 may have the third energy level, and the first energy level, the second energy level, and the third energy level may be different from each other. Alternately, the first electron transport layer ETL-1 may have the first energy level, the second electron transport layer ETL-2 may have the second energy level, and the third electron transport layer ETL-3 may have the third energy level, and the first energy level, the second energy level, and the third energy level may be different from each other.

At least a portion of the first charge transport layer CTR-1 may include a first metal oxide. In an embodiment, the first hole transport layer HTL-1 may include the first metal oxide. Alternatively, the first electron transport layer ETL-1 may include the first metal oxide. However, the present disclosure is not limited thereto, and the first metal oxide may be included in any one of the first hole injection layer HIL-1 or the first electron injection layer EIL-1. In addition, the first metal oxide may be included in two or more of the layers included in the first charge transport layer CTR-1.

At least a portion of the second charge transport layer CTR-2 may include a second metal oxide. In an embodiment, the second hole transport layer HTL-2 may include the second metal oxide. Alternatively, the second electron transport layer ETL-2 may include the second metal oxide. However, the present disclosure is not limited thereto, and the second metal oxide may be included in any one of the second hole injection layer HIL-2 or the second electron injection layer EIL-2. In addition, the second metal oxide may be included in two or more of the layers included in the second charge transport layer CTR-2.

At least a portion of the third charge transport layer CTR-3 may include a third metal oxide. In an embodiment, the third hole transport layer HTL-3 may include the third metal oxide. Alternatively, the third electron transport layer ETL-3 may include the third metal oxide. However, the present disclosure is not limited thereto, and the third metal oxide may be included in any one of the third hole injection layer HIL-3 or the third electron injection layer EIL-3. In addition, the third metal oxide may be included in two or more of the layers included in the third charge transport layer CTR-3.

The charge transport layers CTR-1, CTR-2, and CTR-3 may be formed in the opening OH defined in the pixel defining film PDL through a printing process. At least some of the charge transport layers CTR-1, CTR-2, and CTR-3 include a metal oxide of an embodiment, and may be formed by providing a metal oxide in the opening OH defined in the pixel defining film PDL through a printing process. At least a portion of the first charge transport layer CTR-1 may be formed by providing the first metal oxide in the first opening OH1 through a printing process. At least a portion of the second charge transport layer CTR-2 may be formed by providing the second metal oxide in the second opening OH2 through a printing process. At least a portion of the third charge transport layer CTR-3 may be formed by providing the third metal oxide in the third opening OH3 through a printing process.

The first charge transport layer CTR-1 may have a first thickness d1, and the second charge transport layer CTR-2 may have a second thickness d2, the third charge transport layer CTR-3 may have a third thickness d3, the third thickness d3 may be greater than each of the first thickness d1 and the second thickness d2, and the second thickness d2 may be greater than the first thickness d1. In an embodiment, the first hole transport region HTR-1 included in the first charge transport layer CTR-1 may have a 1-1st thickness d1-1, the second hole transport region HTR-2 included in the second charge transport layer CTR-2 may have a 2-1st thickness d2-1, the third hole transport region HTR-3 included in the third charge transport layer CTR-3 may have a 3-1st thickness d3-1, the 3-1st thickness d3-1 may be greater than each of the 1-1st thickness d1-1 and the 2-1st thickness d2-1, and the 2-1st thickness d2-1 may be greater than the 1-1st thickness d1-1. In an embodiment, the first electron transport region ETR-1 included in the first charge transport layer CTR-1 may have a 1-2nd thickness d1-2, the second electron transport region ETR-2 included in the second charge transport layer CTR-2 may have a 2-2nd thickness d2-2, the third electron transport region ETR-3 included in the third charge transport layer CTR-3 may have a 3-2nd thickness d3-2, the 3-2nd thickness d3-2 may be greater than each of the 1-2nd thickness d1-2 and the 2-2nd thickness d2-2, and the 2-2nd thickness d2-2 may be greater than the 1-2nd thickness d1-2.

In an embodiment, any suitable inorganic material or any suitable organic material may be included in a layer without containing the first to third metal oxides (i.e., the first metal oxide included in the first charge transport layer CTR-1, the second metal oxide included in the second charge transport layer CTR-2, and the third metal oxide included in the third charge transport layer CTR-3) among the first charge transport layer CTR-1, the second charge transport layer CTR-2, and the third charge transport layer CTR-3.

In an embodiment, when the metal oxide of an embodiment is not included in the hole injection layers HIL-1, HIL-2, and HIL-3, the hole injection layers HIL-1, HIL-2, and HIL-3 may include, for example, a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f:2',3'-h]quinoxaline-2,3,6,7,10,11-hexacarbonitrile (HAT-CN), etc.

In an embodiment, when the metal oxide of an embodiment is not included in the hole transport layers HTL-1, HTL-2, and HTL-3, the hole transport layers HTL-1, HTL-2, and HTL-3 may include, for example, carbazole-based derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphtalene-1-yl)-N,N'-diphenyl-benzidine (NPB), 4,4'-cyclohexylidene bis[N,N'-bis(4-methylphenyl)]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

In an embodiment, when the metal oxide of an embodiment is not included in the electron transport layers ETL-1, ETL-2, and ETL-3, the electron transport layers ETL-1, ETL-2, and ETL-3 may include an anthracene-based compound. However, the present disclosure is not limited thereto, and the electron injection layers EIL-1, EIL-2, and EIL-3 may include, for example, tris(8-hydroxyquinolinato) aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole ($^t$Bu-PBD), bis(2-methyl-8-quinolinolato-N1,O8)-(1,1-biphenyl-4-olato)aluminum (BAlq), berylliumbis(benzoquinolin-10-olate) (Bebq$_2$), 9,10-di (naphthalene-2-yl)anthracene (ADN), or a mixture thereof.

In an embodiment, when the metal oxide of an embodiment is not included in the electron injection layers EIL-1, EIL-2, and EIL-3, the electron injection layers EIL-1, EIL-2, and EIL-3 may include, for example, a halogenated metal such as LiF, NaCl, CsF, RbCl, RbI, CuI, and KI, a lanthanide metal such as Yb, or a co-deposition material of the halogenated metal and lanthanide metal above. For example, the electron injection layers EIL-1, EIL-2, and EIL-3 may include KI:Yb, RbI:Yb, etc. as a co-deposition material. In an embodiment, for the electron injection layers EIL-1, EIL-2, and EIL-3, a metal oxide such as Li$_2$O and BaO, or 8-hydroxyl-lithium quinolate (Liq), etc. may be used, but the present disclosure is limited thereto. The electron injection layers EIL-1, EIL-2, and EIL-3 may also be formed of a mixture material of an electron transport material and an insulating organo-metal salt. The organo-metal salt may be a material having an energy band gap of about 4 eV or greater. Specifically, the organo-metal salt may include, for example, metal acetates, metal benzoates, metal acetoacetates, metal acetylacetonates, or metal stearates.

Hereinafter, a case where a metal oxide of an embodiment, that is, each of the first to third metal oxides, is included in at least any one layer among the hole transport regions HTR-1, HTR-2, and HTR-3 of the first to third light emitting elements ED-1, ED-2, and ED-3 will be described as an example. In an embodiment, the first to third metal oxides each may be included in the hole transport layers HTL-1, HTL-2, and HTL-3. The first metal oxide may be included in the first hole transport layer HTL-1, the second metal oxide may be included in the second hole transport layer HTL-2, and the third metal oxide may be included in the third hole transport layer HTL-3.

The first hole transport layer HTL-1 including the first metal oxide may have a first valance band maximum. The second hole transport layer HTL-2 including the second metal oxide may have a second valance band maximum. The third hole transport layer HTL-3 including the third metal oxide may have a third valance band maximum. The second valance band maximum may have a smaller absolute value than the first valance band maximum, and the third valance band maximum may have a smaller absolute value than each of the first valance band maximum and the second valance band maximum. That is, the absolute value of valance band maximum may be set to be descending in the sort order from the first hole transport layer HTL-1 to the second hole transport layer HTL-2 to the third hole transport layer HTL-3.

In an embodiment, at least two of the first to third metal oxides included in the hole transport layers HTL-1, HTL-2, and HTL-3 may be oxides of different metals from each other. The first metal oxide may be an oxide of a first metal, the second metal oxide may be an oxide of a second metal, and the first metal and the second metal may be different from each other. In addition, the third metal oxide may be an oxide of a third metal, and the third metal may be different from each of the first metal and the second metal. The first metal, the second metal, and the third metal may be selected such that the absolute value of the valance band maximum is set to be descending in the sort order from the first hole transport layer HTL-1 to the second hole transport layer HTL-2 to the third hole transport layer HTL-3. In an embodiment, the first metal oxide may be an oxide of nickel (Ni), which is a first metal, the second metal oxide may be an oxide of molybdenum (Mo), which is a second metal, and the third metal oxide may be vanadium (V), which is a third metal.

In another embodiment, at least two of the first to third metal oxides included in the hole transport layers HTL-1, HTL-2, and HTL-3 may be oxides of different oxidation from each other. The first metal oxide may have a first oxidation, the second metal oxide may have a second oxidation, and the first oxidation and the second oxidation may be different from each other. In addition, the third metal oxide may have a third oxidation, and the third oxidation, the first oxidation, and the second oxidation may be different from each other. The first oxidation, the second oxidation, and the third oxidation may be selected such that the absolute value of the valance band maximum is set to be descending in the sort order from the first hole transport layer HTL-1 to the second hole transport layer HTL-2 to the third hole transport layer HTL-3. The metal included in any two selected from the first metal oxide, the second metal oxide, and the third metal oxide may be the same as each other, but the oxidation may be different from each other. In an embodiment, the first metal oxide may be $MoO_3$ and the second metal oxide may be $MoO_2$. In an embodiment, the first metal oxide may be $V_2O_5$ and the second metal oxide may be $V_2O_3$. However, the present disclosure is not limited thereto.

In another embodiment, in the first to third metal oxides included in the hole transport layers HTL-1, HTL-2, and HTL-3, at least two of the metals forming the metal oxide are different from each other, and at least two of the oxidation of the metal oxide may also be different from each other such that the absolute value of the valance band maximum is set to be descending in the sort order from the first hole transport layer HTL-1 to the second hole transport layer HTL-2 to the third hole transport layer HTL-3.

Hereinafter, a case where a metal oxide of an embodiment, that is, each of the first to third metal oxides, is included in at least any one layer among the electron transport regions ETR-1, ETR-2, and ETR-3 of the first to third light emitting elements ED-1, ED-2, and ED-3 will be described as an example. In an embodiment, the first to third metal oxides each may be included in the electron transport layers ETL-1, ETL-2, and ETL-3. The first metal oxide may be included in the first electron transport layer ETL-1, the second metal oxide may be included in the second electron transport layer ETL-2, and the third metal oxide may be included in the third electron transport layer ETL-3.

The first electron transport layer ETL-1 including the first metal oxide may have a first conduction band minimum. The second electron transport layer ETL-2 including the second metal oxide may have a second conduction band minimum. The third electron transport layer ETL-3 including the third metal oxide may have a third conduction band minimum. The second conduction band minimum may have a greater absolute value than the first conduction band minimum, and the third conduction band minimum may have a greater absolute value than each of the first conduction band minimum and the second conduction band minimum. That is, it may be set such that the absolute values of the conduction band minimum are ascending in the sort order from the first electron transport layer ETL-1 to the second electron transport layer ETL-2 to the third electron transport layer ETL-3.

In an embodiment, at least two of the first to third metal oxides included in the electron transport layers ETL-1, ETL-2, and ETL-3 may be oxides of different metals from each other. The first metal oxide may be an oxide of a first metal, the second metal oxide may be an oxide of a second metal, and the first metal and the second metal may be different from each other. In addition, the third metal oxide may be an oxide of a third metal, and the third metal may be different from the first metal and the second metal. The first metal, the second metal, and the third metal may be selected such that the conduction band minimum is set to be ascending in the sort order from the first electron transport layer ETL-1 to the second electron transport layer ETL-2 to the third electron transport layer ETL-3. In an embodiment, the first metal oxide may be an oxide of zinc (Zn), which is a first metal, and the second metal oxide may be an oxide of titanium (Ti), which is a second metal.

In another embodiment, at least two of the first to third metal oxides included in the electron transport layers ETL-1, ETL-2, and ETL-3 may be an oxide of a material in which a main metal is doped with a doping metal, and the doping ratio of the doping metal may be different from each other. The doping metal may be a metal to n-dope the main metal. When the doping ratio of the doping metal in the first metal oxide is defined as a first doping ratio, and the doping ratio of the doping metal in the second metal oxide is defined as a second doping ratio, the first doping ratio and the second doping ratio may be different from each other. In addition, when the doping ratio of the doping metal in the third metal oxide is defined as a third doping ratio, the third doping ratio may be different from the first doping ratio and the second doping ratio. The first doping ratio, the second doping ratio, and the third doping ratio may be selected such that the absolute value of the conduction band minimum is set to be ascending in the sort order from the first electron transport layer ETL-1 to the second electron transport layer ETL-2 to the third electron transport layer ETL-3. The main metal and the doping metal included in any two selected from the first metal oxide, the second metal oxide, and the third metal oxide may be the same as each other, and only the doping ratio of the doping metal may be different from each other. In an embodiment, the first metal oxide, the second metal oxide, and the third metal oxide may be an oxide of a material in which magnesium (Mg) is doped on zinc, and the ratio of zinc and magnesium in the first metal oxide may be 85:15, the ratio of zinc and magnesium in the second metal oxide may be 90:10, and the ratio of zinc and magnesium in the third metal oxide may be 95:5. Alternately, the first metal oxide, the second metal oxide, and the third metal oxide may be an oxide of a material in which aluminum (Al) is doped on zinc, and the ratio of zinc and aluminum in the first metal oxide may be 85:15, the ratio of zinc and aluminum in the second metal oxide may be 90:10, and the ratio of zinc and aluminum in the third metal oxide may be 95:5.

In another embodiment, at least two of the first to third metal oxides included in the electron transport layers ETL-1, ETL-2, and ETL-3 may be an oxide of a material in which a main metal is doped with a doping metal, and may have different doping metals from each other. The doping metal may be a metal to n-dope the main metal. The first metal oxide may include a first main metal and a first doping metal doped thereon, and the second metal oxide may include a second main metal and a second doping metal doped thereon, and the first doping metal and the second doping metal may be different from each other. In addition, the third metal oxide may include a third main metal and a third doping metal doped thereon, and the third doping metal may be different from the first doping metal and the second doping metal. The first doping metal, the second doping metal, and the third doping metal may be selected such that the absolute values of the conduction band minimum are set to be ascending in the sort order from the first electron transport layer ETL-1 to the second electron transport layer ETL-2 to the third electron transport layer ETL-3. The first main metal, the second main metal, and the third main metal may be the same as each other. That is, the first to third metal oxides may be different only in doping metals for the same main metal. In an embodiment, the first metal oxide may be an oxide of a metal in which magnesium is doped on zinc, the second metal oxide may be an oxide of a metal in which lithium (Li) is doped on zinc, and the third metal oxide may be an oxide of a metal gallium (Ga) is doped on zinc.

In another embodiment, at least one of the first to third metal oxides included in the electron transport layers ETL-1, ETL-2, and ETL-3 may include a metal oxide particle and a shell surrounding the metal oxide particle. The shell may be an inorganic material such as a metal oxide, or an organic polymer material. The shell may be a material having a smaller absolute value of conduction band minimum than the metal oxide particle. Whether the shell is included or not may be selected such that the absolute values of the conduction band minimum are set to be ascending in the sort order from the first electron transport layer ETL-1 to the second electron transport layer ETL-2 to the third electron transport layer ETL-3. The first metal oxide may include a metal oxide particle and a shell surrounding the particle, and the second metal oxide may not include a shell. In an embodiment, the first metal oxide and the second metal oxide may include a titanium oxide particle, and the first metal oxide may further include a magnesium oxide shell surrounding the titanium oxide particle. Alternatively, the first metal oxide and the second metal oxide may include a zinc oxide particle, and the first metal oxide may include ethanolamine shell, a polyethyleneimine shell, a polyvinylpyrrolidone shell, and/or a polymethylmethacrylate shell.

In a display device including first to third light emitting elements according to an embodiment, the first to third light emitting elements each include an emission layer containing quantum dots and a charge transport layer disposed adjacent thereto, and at least some of the charge transport layers of each of the first to third light emitting elements contain metal oxides. In this case, the metal oxides included in the charge transport layers of each of the first to third light emitting elements may be different from each other. To be more specific, the metal oxides included in the charge transport layers of each of the first to third light emitting elements may be materials having different energy levels from each other. Accordingly, the energy levels of the adjacent charge transport layer may be controlled to meet the energy levels of the first to third light emitting elements emitting lights of different wavelengths from each other, and thus, the display efficiency of the display device may be increased.

More specifically, the first emission layer of the first light emitting element includes the first quantum dot emitting blue light, the second emission layer of the second light emitting element includes the second quantum dot emitting green light, and the third emission layer of the third light emitting element includes the third quantum dot emitting red light, and the first emission layer may have a greatest band gap energy (e.g., a greater band gap energy than each of the second emission layer and the third emission layer), the second emission layer may have a smaller band gap energy than the first emission layer, and the third emission layer may have a smaller band gap energy than the first emission layer and the second emission layer. That is, the band gap energy of the first emission layer, the band gap energy of the second emission layer, and the band gap energy of the third emission layer may be set in descending order. Accordingly, at least a portion of the charge transport layer disposed adjacent to the first emission layer, the second emission layer, and the third emission layer may contain metal oxides selected to go along with the descending order of the band gap energy. Specifically, the first hole transport layer, the second hole transport layer, and the third hole transport layer may include metal oxides different from one another such that the absolute values of the first valance band maximum of the first hole transport layer, the second valance band maximum of the second hole transport layer, and the third valance band maximum of the third hole transport layer are set to be in descending order. Alternatively, the first electron transport layer, the second electron transport layer, and the third electron transport layer may include different metal oxides from each other such that the absolute values of the first conduction band minimum of the first electron transport layer, the second conduction band minimum of the second electron transport layer, and the third conduction band minimum of the third electron transport layer are set to be in ascending order. Accordingly, adjacent layer energy levels going along with the band gap energy order of the first to third emission layers may be included, and thus, the display efficiency of a display device including the first to third light emitting elements may be optimized or improved.

According to an embodiment of the present disclosure, energy levels of an adjacent charge transport layer may be controlled to meet energy levels of the light emitting materials included in each light emitting element for light emitting elements emitting light of different wavelengths from each other, and the display efficiency of a display device may thus be increased.

Although the present disclosure has been described with reference to an embodiment of the present disclosure, it will be understood that the present disclosure should not be limited to these embodiments but various suitable changes and modifications can be made by those skilled in the art without departing from the spirit and scope of the present disclosure. Accordingly, the technical scope of the present disclosure is not intended to be limited to the contents set forth in the detailed description of the specification, but is intended to be defined by the appended claims, and equivalents thereof.

What is claimed is:

1. A display device comprising:
a first light emitting element comprising a first emission layer and a first charge transport layer adjacent to the first emission layer, the first emission layer comprising a first quantum dot to emit first light; and
a second light emitting element comprising a second emission layer and a second charge transport layer adjacent to the second emission layer, the second emission layer comprising a second quantum dot to emit second light that is longer in wavelength than the first light,
wherein the first charge transport layer comprises a first metal oxide,
wherein the second charge transport layer comprises a second metal oxide different from the first metal oxide,
wherein the first charge transport layer comprises a first hole transport layer and a first electron transport layer spaced from the first hole transport layer with the first emission layer therebetween, wherein the second charge transport layer comprises a second hole transport layer and a second electron transport layer spaced from the second hole transport layer with the second emission layer therebetween, wherein the first hole transport layer comprises the first metal oxide, and wherein the second hole transport layer comprises the second metal oxide.

2. The display device of claim 1, wherein the first charge transport layer has a first energy level, and wherein the second charge transport layer has a second energy level different from the first energy level.

3. The display device of claim 1, wherein the first electron transport layer has a first conduction band minimum, and wherein the second electron transport layer has a second conduction band minimum, the second conduction band minimum being greater in absolute value than the first conduction band minimum.

4. The display device of claim 1, wherein the first electron transport layer comprises the first metal oxide, and wherein the second electron transport layer comprises the second metal oxide.

5. The display device of claim 1, further comprising a pixel defining film defining a plurality of openings in which the first light emitting element and the second light emitting element are arranged, wherein the first charge transport layer and the second charge transport layer are in the plurality of openings.

6. The display device of claim 1, wherein the first metal oxide is an oxide of a first metal, and wherein the second metal oxide is an oxide of a second metal, the first metal and the second metal being different from each other.

7. The display device of claim 1, wherein the first metal oxide and the second metal oxide each are an oxide of a material in which a main metal is doped with a doping metal, and wherein a first doping ratio of the doping metal in the first metal oxide is different from a second doping ratio of the doping metal in the second metal oxide.

8. The display device of claim 1, wherein the first metal oxide is an oxide of a material in which a first main metal is doped with a first doping metal, wherein the second metal oxide is an oxide of a material in which a second main metal is doped with a second doping metal, and wherein the first doping metal and the second doping metal are different from each other.

9. The display device of claim 1, wherein one of the first metal oxide or the second metal oxide comprises a metal oxide particle and a shell surrounding the metal oxide particle, the metal oxide particle and the shell having different energy levels from each other.

10. The display device of claim 1, wherein a first oxidation of the first metal oxide is different from a second oxidation of the second metal oxide.

11. The display device of claim 1, wherein the first charge transport layer is smaller in thickness than the second charge transport layer.

12. A method for manufacturing the display device of claim 1, the method comprising:

manufacturing the first light emitting element comprising the first emission layer and the first charge transport layer adjacent to the first emission layer, the first emission layer comprising the first quantum dot to emit the first light; and manufacturing the second light emitting element comprising the second emission layer and the second charge transport layer adjacent to the second emission layer, the second emission layer comprising the second quantum dot to emit the second light that is longer in wavelength than the first light, wherein the first charge transport layer is formed by providing the first metal oxide through a printing process, wherein the second charge transport layer is formed by providing the second metal oxide different from the first metal oxide through a printing process, wherein the first charge transport layer comprises the first hole transport layer and the first electron transport layer spaced from the first hole transport layer with the first emission layer therebetween, wherein the second charge transport layer comprises the second hole transport layer and the second electron transport layer spaced from the second hole transport layer with the second emission layer therebetween, wherein the first hole transport layer comprises the first metal oxide, and wherein the second hole transport layer comprises the second metal oxide.

13. The method of claim 12, further comprising forming a pixel defining film defining a plurality of openings in which the first light emitting element and the second light emitting element are arranged, wherein the first charge transport layer is formed by applying the first metal oxide to a first opening from among the plurality of openings, and wherein the second charge transport layer is formed by applying the second metal oxide to a second opening from among the plurality of openings.

14. The method of claim 12, wherein the first hole transport layer has a first valance band maximum, and the second hole transport layer has a second valance band maximum, and wherein the second valance band maximum is smaller in absolute value than the first valance band maximum.

15. The method of claim 12, wherein the first electron transport layer has a first conduction band minimum, and the second electron transport layer has a second conduction band minimum, and wherein the second conduction band minimum is greater in absolute value than the first conduction band minimum.

16. A display device comprising:

a first light emitting element comprising a first emission layer and a first charge transport layer adjacent to the first emission layer, the first emission layer comprising a first quantum dot to emit first light; and a second light emitting element comprising a second emission layer and a second charge transport layer adjacent to the second emission layer, the second emission layer comprising a second quantum dot to emit second light that is longer in wavelength than the first light, wherein the first charge transport layer comprises a first metal oxide, wherein the second charge transport layer comprises a second metal oxide different from the first metal oxide, wherein the first charge transport layer comprises a first hole transport layer and a first electron transport layer spaced from the first hole transport layer with the first emission layer therebetween, wherein the second charge transport layer comprises a second hole transport layer and a second electron transport layer spaced from the second hole transport layer with the second emission layer therebetween, wherein the first hole transport layer has a first valance band maximum, and wherein the second hole transport layer has a second valance band maximum, the second valance band maximum being smaller in absolute value than the first valance band maximum.

17. A display device comprising:

a first light emitting element comprising a first emission layer and a first charge transport layer adjacent to the first emission layer, the first emission layer comprising a first quantum dot to emit first light; and a second light emitting element comprising a second emission layer and a second charge transport layer adjacent to the second emission layer, the second emission layer comprising a second quantum dot to emit second light that is longer in wavelength than the first light, wherein the first charge transport layer comprises a first material, wherein the second charge transport layer comprises a second material different from the first material, wherein the first charge transport layer has a first energy level, wherein the second charge transport layer has a second energy level, wherein the first energy level and the second energy level are different from each other, wherein the first charge transport layer comprises a first hole transport layer and a first electron transport layer spaced from the first hole transport layer with the first emission layer therebetween, wherein the second charge transport layer comprises a second hole transport layer and a second electron transport layer spaced from the second hole transport layer with the second emission layer therebetween, wherein the first hole transport layer has the first energy level, and wherein the second hole transport layer has the second energy level.

18. The display device of claim 17, further comprising a pixel defining film defining a plurality of openings in which the first light emitting element and the second light emitting element are arranged, wherein the first charge transport layer and the second charge transport layer are in the plurality of openings.

* * * * *

UNITED STATES PATENT AND TRADEMARK OFFICE
CERTIFICATE OF CORRECTION

| | | |
|---|---|---|
| PATENT NO. | : 11,765,954 B2 | Page 1 of 1 |
| APPLICATION NO. | : 17/354210 | |
| DATED | : September 19, 2023 | |
| INVENTOR(S) | : Jingoo Kang et al. | |

It is certified that error appears in the above-identified patent and that said Letters Patent is hereby corrected as shown below:

On the Title Page

In item (54), in Column 1, in "Title", Lines 1-2, delete "DISPLAY DEVICE AND METHOD FOR MANUFACTURING THE SAME" and insert -- DISPLAY DEVICE HAVING AN EMISSION LAYER INCLUDING QUANTUM DOTS AND METHOD FOR MANUFACTURING THE SAME --.

In the Specification

In Column 1, Lines 1-2, delete "DISPLAY DEVICE AND METHOD FOR MANUFACTURING THE SAME" and insert -- DISPLAY DEVICE HAVING AN EMISSION LAYER INCLUDING QUANTUM DOTS AND METHOD FOR MANUFACTURING THE SAME --.

Signed and Sealed this
Thirteenth Day of February, 2024

Katherine Kelly Vidal
*Director of the United States Patent and Trademark Office*